(12) United States Patent
Park et al.

(10) Patent No.: US 10,103,070 B2
(45) Date of Patent: Oct. 16, 2018

(54) DYNAMIC INTEGRATED CIRCUIT FABRICATION METHODS

(71) Applicant: GLOBALFOUNDRIES Inc., Grand Cayman (KY)

(72) Inventors: Dongsuk Park, Mechanicville, NY (US); Wangkeun Cho, Mechanicville, NY (US); Wen Hua Cheng, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 66 days.

(21) Appl. No.: 14/671,265

(22) Filed: Mar. 27, 2015

(65) Prior Publication Data

US 2016/0284609 A1 Sep. 29, 2016

(51) Int. Cl.
| | | |
|---|---|---|
| *H01L 21/66* | (2006.01) | |
| *G01B 21/08* | (2006.01) | |
| *G01B 21/04* | (2006.01) | |

(52) U.S. Cl.
CPC .............. *H01L 22/20* (2013.01); *G01B 21/04* (2013.01); *G01B 21/08* (2013.01); *H01L 22/12* (2013.01)

(58) Field of Classification Search
CPC ......... H01L 22/20; H01L 22/12; G01B 21/08; G01B 21/04
USPC ....................................................... 324/464
See application file for complete search history.

(56) References Cited

U.S. PATENT DOCUMENTS

| | | | | |
|---|---|---|---|---|
| 5,664,987 | A * | 9/1997 | Renteln ................. | B24B 37/005 451/21 |
| 5,982,166 | A * | 11/1999 | Mautz ..................... | H01L 21/68 324/750.19 |
| 6,022,807 | A * | 2/2000 | Lindsey, Jr. ............ | B24B 37/04 216/38 |
| 2005/0253080 | A1* | 11/2005 | Janik ........................ | G01J 3/10 250/372 |
| 2008/0241969 | A1* | 10/2008 | Winkler .............. | G03F 7/70525 438/5 |
| 2008/0241970 | A1* | 10/2008 | Winkler ............ | H01L 21/67253 438/5 |
| 2008/0241971 | A1* | 10/2008 | Winkler ............ | H01L 21/67225 438/5 |
| 2008/0243294 | A1* | 10/2008 | Winkler ........... | G05B 19/41875 700/121 |

(Continued)

Primary Examiner — Christopher McAndrew
(74) Attorney, Agent, or Firm — Heslin Rothenberg Farley & Mesiti P.C.; Jacquelyn A. Graff (57) ABSTRACT

Methods and processes for forming semiconductor devices with reduced yield loss and failed dies are provided. One method includes, for instance: obtaining a wafer after at least one fabrication processing; taking first r, θ, z measurements of the wafer after the at least one fabrication processing; performing at least one second fabrication processing; taking second r, θ, z measurements of the wafer after the at least one second fabrication processing; and analyzing the second r, θ, z measurements with respect to the first r, θ, z measurements. A process includes, for instance: obtaining a wafer with a substrate and at least one first device positioned on the substrate; taking first measurements in a r, θ, z coordinate system; forming at least one second device over the substrate; taking second measurements in the r, θ, z coordinate system; and analyzing the second measurements with respect to the first measurements.

20 Claims, 5 Drawing Sheets

(56) References Cited

U.S. PATENT DOCUMENTS

| | | | |
|---|---|---|---|
| 2008/0243295 A1* | 10/2008 | Winkler | G05B 23/0264 |
| | | | 700/121 |
| 2008/0243297 A1* | 10/2008 | Winkler | G05B 19/41875 |
| | | | 700/121 |
| 2009/0177311 A1* | 7/2009 | Winkler | G03F 7/70525 |
| | | | 700/121 |
| 2013/0244430 A1* | 9/2013 | Lin | H01L 29/49 |
| | | | 438/692 |
| 2015/0041932 A1* | 2/2015 | Herrin | B81C 1/00476 |
| | | | 257/418 |

* cited by examiner

FIG. 7 dynamic integrated circuit
fabrication methods

FIELD OF THE INVENTION

The present invention relates to semiconductor devices and methods of fabricating semiconductor devices, and more particularly, to fabrication methods and processes for semiconductor production.

BACKGROUND OF THE INVENTION

As semiconductor devices continue to decrease in size, product quality control is becoming more challenging. Fabrication processes have been optimized to ensure proper overlay of devices and layers with respect to the other devices and layers of the semiconductors. However, yield loss and failed dies are still produced by current fabrication methods. Thus, improved processes are needed to reduce both yield loss and failed dies.

SUMMARY OF THE INVENTION

The shortcomings of the prior art are overcome and additional advantages are provided through the provision, in one aspect, a method includes, for instance: obtaining a wafer after at least one fabrication processing; taking first r, θ, z measurements of the wafer after the at least one fabrication processing; performing at least one second fabrication processing; taking second r, θ, z measurements of the wafer after the at least one second fabrication processing; and analyzing the second r, θ, z measurements with respect to the first r, θ, z measurements.

In another aspect, a process is provided which includes, for instance: obtaining a wafer with a substrate and at least one first device positioned on the substrate; taking first measurements in a r, θ, z coordinate system; forming at least one second device over the substrate; taking second measurements in the r, θ, z coordinate system; and analyzing the second measurements with respect to the first measurements.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for wafers with a reduction in failed devices and yield loss.

Figure 1:
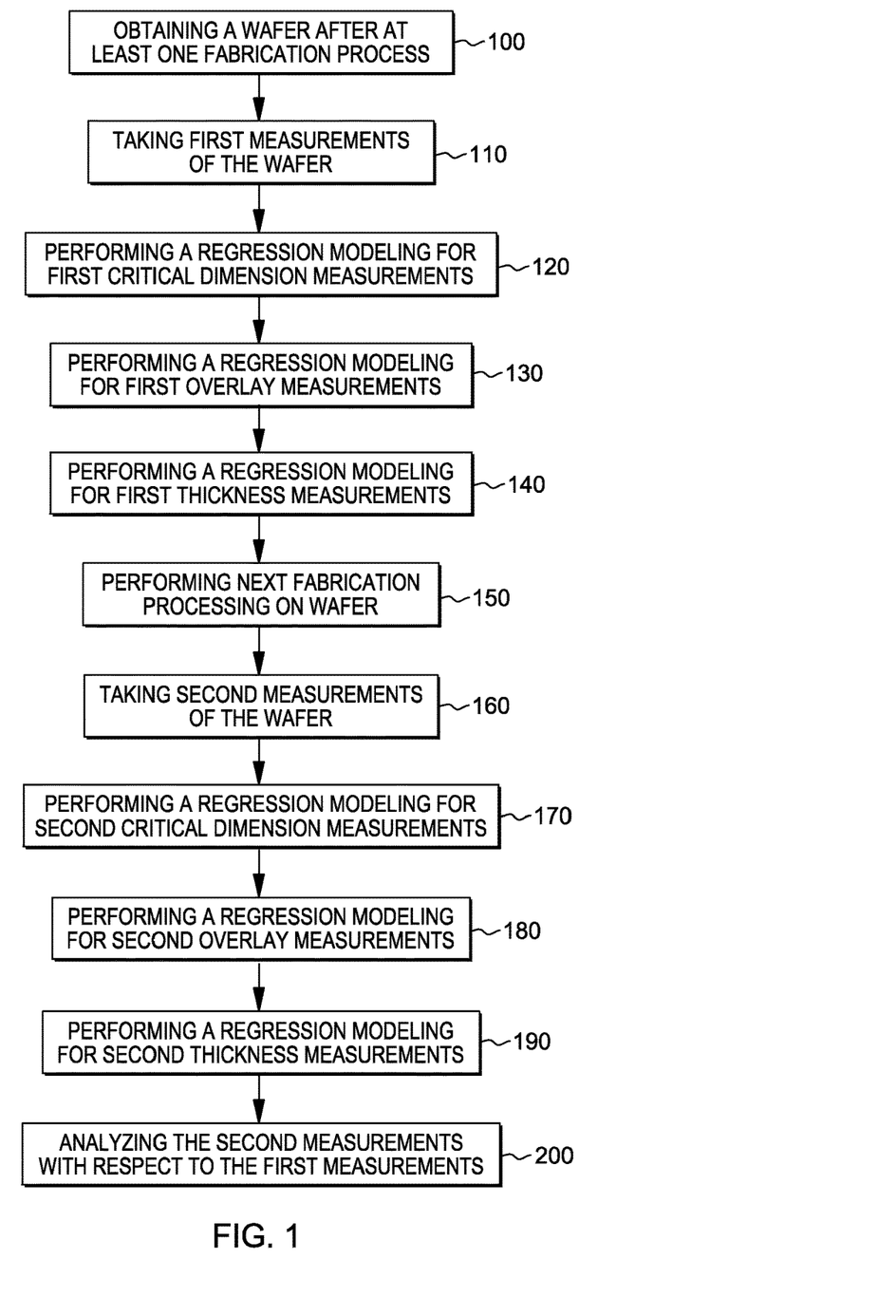
FIG. 1 depicts one embodiment of a method for forming an integrated circuit using dynamic processing, in accordance with one or more aspects of the present invention.

In one aspect, in one embodiment, as shown in FIG. 1, semiconductor device formation process in accordance with one or more aspects of the present invention may include, for instance: obtaining a wafer after at least one fabrication process 100; taking first r, θ, z measurements of the wafer 110; performing a regression modeling for first critical dimension measurements 120; performing a regression modeling for first overlay measurements 130; performing a regression modeling for first thickness measurements 140; performing at least one additional fabrication processing on the wafer 150; taking second r, θ, z measurements of the wafer 160; performing a regression modeling for second critical dimension measurements 170; performing a regression modeling for second overlay measurements 180; performing a regression modeling for second thickness measurements 190; and analyzing the second critical dimension, overlay, and thickness measurements with respect to the first critical dimension, overlay, and thickness measurements 200.

FIGS. 2-7 depict, by way of example only, several detailed embodiments of a portion of the FinFET device formation process of FIG. 1 and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 2:
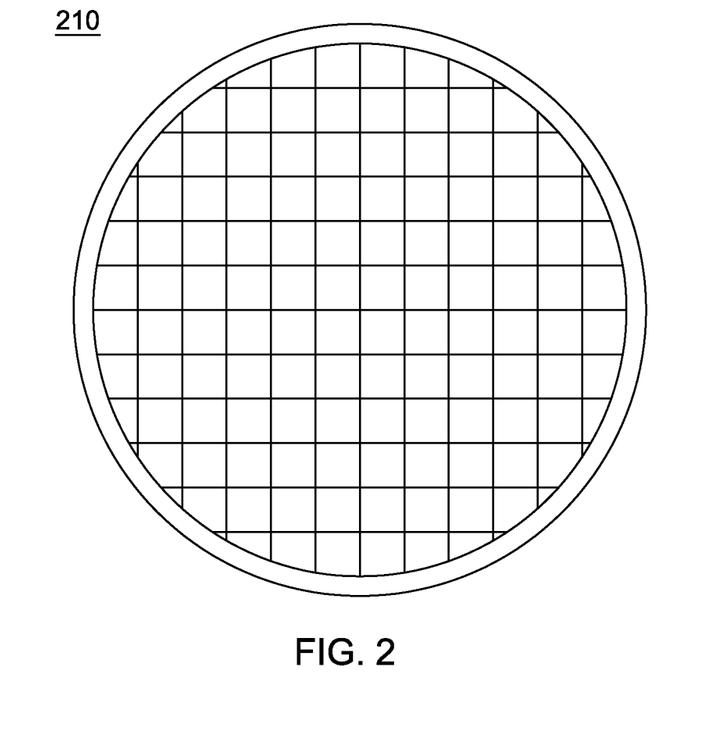
FIG. 2 depicts a top view of a wafer, in accordance with one or more aspects of the present invention.
Figure 3:
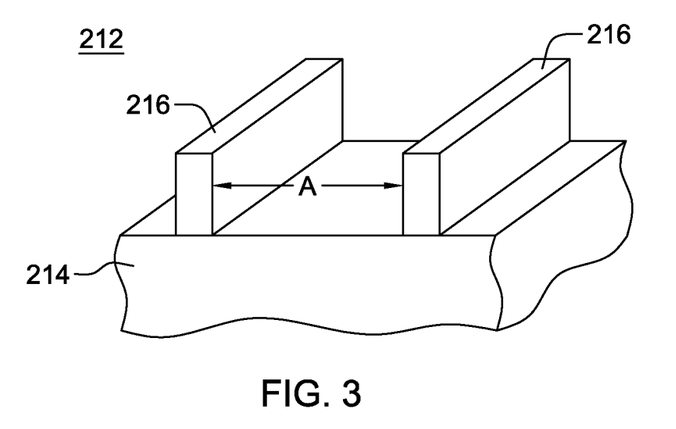
FIG. 3 depicts a cross-sectional elevation view of a portion of the wafer after a first fabrication process is performed on the wafer, in accordance with one or more aspects of the present invention.

One detailed embodiment of a portion of the FinFET device formation process of FIG. 1 is depicted, by way of example only, in FIGS. 2-6. FIG. 2 shows a wafer 210 being processed through device fabrication. A portion 212 of the wafer 210 is shown in FIGS. 3-7. The portion 212 may include a substrate 214 with at least one device 216 positioned over the substrate 214, as shown in FIG. 3. Two devices 216 are shown in FIG. 3 and are separated by a distance A. The devices 216 may be, for example, fins, source, drain, gate, contacts, transistors, or any other semiconductor structure which requires overlay measurement.

Figure 4:
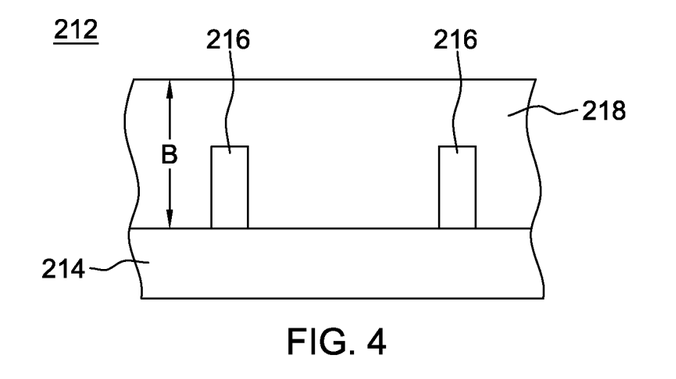
FIG. 4 depicts a front, cross-sectional view of the structure of FIG. 3 after depositing a layer, in accordance with one or more aspects of the present invention.

A dielectric material 218, for example, an oxide layer, may be deposited over the at least one device 216 and substrate 214, as shown in FIG. 4. The dielectric material 218 may have a thickness B from a top surface of the substrate 214. After the at least one device 216 is formed, first r, θ, z measurements may be taken. The first r, θ, z measurements may be taken using any semiconductor fabrication tool which provides measurements, for example, any metrology instrument. The first r, θ, z measurements may then be used to perform a regression modeling analysis to determine first critical dimension measurements, first overlay measurements, and first thickness measurements. The regression modeling analysis may be performed, for example, by any known regression modeling analysis.

Figure 5:
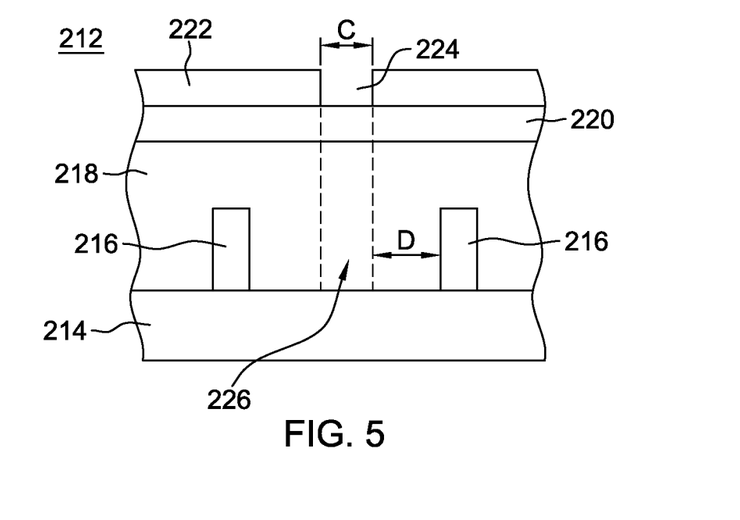
FIG. 5 depicts the structure of FIG. 4 after depositing a second and third layer over the wafer and patterning the third layer, in accordance with one or more aspects of the present invention.
Figure 6:
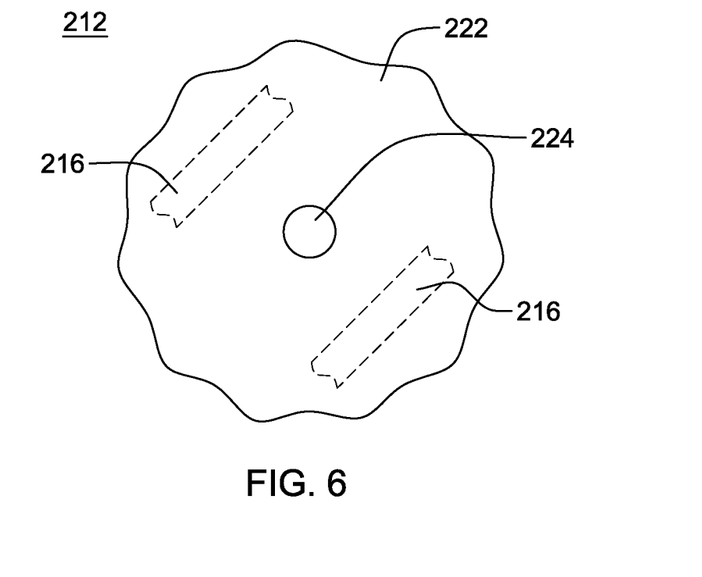
FIG. 6 depicts a top view of the structure of FIG. 5, in accordance with one or more aspects of the present invention.

Next, a layer 220, for example, a mask layer, may be deposited over the dielectric material 218 and a photoresist layer 222 may be deposited over the mask layer 220, as shown in FIG. 5. The portion 212 may also include at least one opening 224 patterned into the photoresist layer 222, also shown in FIG. 5. The at least one opening 224 may have a width C. The width C may, for example, represent the critical dimension of the opening 224 being etched. FIG. 5 also shows the area 226 that will be etched from the opening 224 in the photoresist layer 222. The area 226 is separated from one device 216 of the at least one device 216 by a distance D. The distance A should be greater than the sum of the width C and distance D to prevent overlay errors. As shown in FIG. 6, the top view illustrates the opening 224 in the photoresist layer 222. The photoresist layer 222 is transparent in FIG. 6 to show the devices 216 in the layers below the photoresist layer 222. As illustrated, the at least one opening 224 has a critical dimension to fit between the device 216 and is properly aligned between the devices 216.

Before etching is performed over the photoresist layer 222, a regression modeling may be performed to confirm the overlay and critical dimension of the at least one opening 224 on the wafer 210. The second regression modeling analysis is performed by first taking second r, θ, z measurements. Then, the r, θ, z measurements are used to perform a second regression modeling analysis to determine second critical dimension measurements, second overlay measurements, and second thickness measurements. The second critical dimension, overlay, and thickness measurements may then be compared to the first critical dimension, overlay, and thickness measurements to determine if the devices formed using the openings 224 will be properly aligned with respect to devices 216. By performing the regression analysis prior to etching, it may be determined if the area 226 overlaps any of the devices 216 in the layers below the photoresist layer 222 and if necessary allow for correction of the positioning of the at least one opening 224 before etching is performed. By allowing for correction during fabrication processing, misalignment and critical dimension errors that result in integrated circuit devices with low yields may be decreased or avoided.

Figure 7:
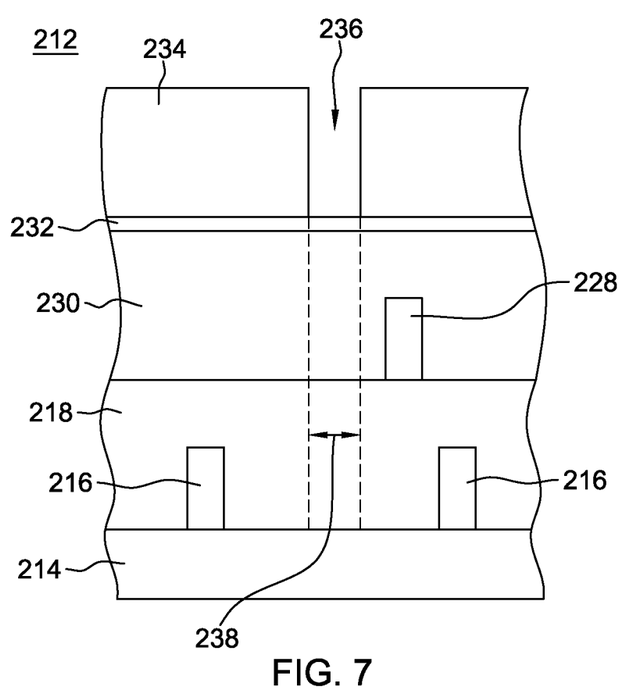
FIG. 7 depicts another embodiment cross-sectional view of the structure of FIG. 4 after additional fabrication processing, in accordance with one or more aspects of the present invention.

Additional fabrication processes may be performed over the wafer 210, after which additional r, θ, z measurements may be taken to perform regression modeling and to ensure the critical dimensions and overlay of the devices will not result in yield loss. For example, as shown in FIG. 7, at least one second device 228 may be formed over the layer 218 on the portion 212 of the wafer 210. A second dielectric layer 230, for example, an oxide layer, may be deposited over the wafer 210 after the at least one second device 228 is formed. Then third r, θ, z measurements may be taken and a third regression modeling analysis performed to determine third critical dimension measurements, third overlay measurements, and thickness measurements. The third critical dimension, overlay, and thickness measurements may then be compared to the second critical dimension, overlay, and thickness measurements as well as the first critical dimension, overlay, and thickness measurements.

Next, a mask layer 232 may be applied over the wafer 210. A second photoresist layer 234 may be applied over the mask layer 232 and the second photoresist layer 234 may be patterned to form at least one opening 236. After the second photoresist layer 234 is patterned, fourth r, θ, z measurements may be taken and a fourth regression modeling analysis may be performed to determine fourth critical dimension measurements, overlay measurements, and thickness measurements for the openings 236. Then the fourth critical dimension measurements, overlay measurements, and thickness measurements may be compared to the first, second and third critical dimension measurements, overlay measurements, and thickness measurements to ensure that an opening etched into the area 238 will not be positioned to close to or overlapping with the devices 216, 228 in the layers positioned below the photoresist layer 234. Additional layers and devices may be deposited or formed on the wafer 210 and after each fabrication process, r, θ, z measurements may be taken and another regression modeling analysis performed to access the positioning or placement of the later devices. After each regression modeling analysis the health of the entire wafer may be assessed based on the number of chips on the wafer that have critical dimension or overlay errors.

For example, after several fabrication processes are performed on a wafer 210, such as shown in FIG. 7, the wafer 210 may be analyzed to determine the number of wafers that pass the device specifications, in other words the yield of acceptable wafers. If the measurements of the wafer 210 are taken using a static specification, which measures in the x, y direction and regression modeling is performed, it may be shown that all of the devices on the wafer 210 will be acceptable. If measurements are taken on the same wafer 210 in the r and θ directions and regression modeling is performed, it may be found, for example, that only approximately forty percent of the devices will be acceptable. However, if measurements are taken on the same wafer 210 in the r, θ, and z direction and regression modeling is performed, it may be found, for example, that approximately seventy percent of the devices will be acceptable. Thus, by measuring in the r, θ, and z direction a more accurate number of devices that will fail after fabrication is completed can be determined, than by measuring either the x, y direction or the r and θ direction. Further, regression modeling that is performed from the r, θ, and z measurements may provide data which may be used to adjust later fabrication processes to account for any minor overlay or critical dimension errors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining a wafer after at least one fabrication process to form at least one first device on a first layer, wherein the at least one first device is a fin, a source, a drain, a gate, a contact, or a transistor;
    taking first r, θ, z measurements of the at least one first device on the first layer using a semiconductor fabrication tool;
    depositing a photoresist layer over the first layer;
    patterning at least one opening in the photoresist layer for forming at least one second device on a second layer, wherein the second layer is positioned over the first layer, and wherein the at least one second device is a fin, a source, a drain, a gate, a contact, or a transistor;
    taking second r, θ, z measurements of the at least one opening in the photoresist layer using the semiconductor fabrication tool; and
    analyzing the second r, θ, z measurements with respect to the first r, θ, z measurements to find alignment and critical dimension errors between the at least one first device on the first layer and the at least one opening in the photoresist layer before forming the at least one second device on the second layer.

2. The method of claim 1, further comprising:
    performing a first regression modeling with the first r, θ, z measurements to determine first critical dimension measurements;
    performing a second regression modeling with the first r, θ, z measurements to determine first overlay measurements; and
    performing a third regression modeling with the first r, θ, z measurements to determine first thickness measurements.

3. The method of claim 2, further comprising:
    performing a first regression modeling with the second r, θ, z measurements to determine second critical dimension measurements;
    performing a second regression modeling with the second r, θ, z measurements to determine second overlay measurements; and
    performing a third regression modeling with the second r, θ, z measurements to determine second thickness measurements.

4. The method of claim 3, further comprising:
    comparing the second critical dimension measurements of the at least one opening in the photoresist layer for forming the at least one second device on the second layer to the first critical dimension measurements of the at least one first device on the first layer;
    comparing the second overlay measurements of the at least one opening in the photoresist layer for forming the at least one second device on the second layer to the first overlay measurements of the at least one first device on the first layer; and
    comparing the second thickness measurements of the at least one opening in the photoresist layer for forming the at least one second device on the second layer to the first thickness measurements of the at least one first device on the first layer.

5. The method of claim 4, further comprising:
    performing at least one third fabrication processing to form at least one third device on at least a third layer over the first and second layers;
    taking third r, θ, z measurements of the at least one second opening for forming the at least one third device using a semiconductor fabrication tool; and
    analyzing the third r, θ, z measurements for the at least one third device on the third layer with respect to the first r, θ, z measurements for the at least one first device on the first layer and the second r, θ, z measurements for the at least one second device on the second layer.

6. The method of claim 5, further comprising:
    performing a first regression modeling with the third r, θ, z measurements to determine third critical dimension measurements;
    performing a second regression modeling with the third r, θ, z measurements to determine third overlay measurements; and
    performing a third regression modeling with the third r, θ, z measurements to determine third thickness measurements.

7. The method of claim 6, wherein analyzing the third r, θ, z measurements with respect to the first r, θ, z measurements and the second r, θ, z measurements comprises:
    comparing the third critical dimension measurements of the at least one second opening for forming the at least one third device on the third layer to the first critical dimension measurements of the at least one first device on the first layer and the second critical dimension measurements of the at least one second device on the second layer;
comparing the third overlay measurements of the at least one second opening for forming the at least one third device on the third layer to the first overlay measurements of the at least one first device on the first layer and the second overlay measurements of the at least one second device on the second layer; and
comparing the third thickness measurements of the at least one second opening for forming the at least one third device on the third layer to the first thickness measurements of the at least one first device on the first layer and the second thickness measurements of the at least one second device on the second layer.

8. The method of claim 4, further comprising:
calculating available area in the wafer for at least one third fabrication processing; and
determining if the at least one third fabrication processing has a critical dimension and overlay to be positioned in the open area.

9. The method of claim 8, further comprising:
adjusting critical dimensions and overlay of the at least one third fabrication processing.

10. The method of claim 4, further comprising:
analyzing the first and second critical dimension measurements, first and second overlay measurements, and first and second thickness measurements to determine a number of chips on different layers of the wafer with critical dimension and overlay errors.

11. A process comprising:
obtaining a wafer with a substrate and at least one first device positioned on the substrate in a first layer;
using a metrology instrument to obtain first measurements in a r, θ, z coordinate system of the at least one first device in the first layer;
depositing a photoresist layer over the first layer;
forming at least one opening in the photoresist layer for forming at least one second device over the substrate in a second layer, wherein the second layer is positioned over the first layer;
using the metrology instrument to obtain second measurements in the r, θ, z coordinate system of the at least one opening in the photoresist layer; and
analyzing the second measurements with respect to the first measurements to find misalignment and critical dimension errors between the at least one first device on the first layer and the at least one opening in the photoresist layer before forming the at least one second device in the second layer.

12. The process of claim 11, further comprising:
determining first critical dimension measurements by performing a first regression analysis with the first measurements;
determining first overlay measurements by performing a second regression analysis with the first measurements; and
determining first thickness measurements by performing a third regression analysis with the first measurements.

13. The process of claim 12, further comprising:
determining second critical dimension measurements by performing a fourth regression analysis with the second measurements;
determining second overlay measurements by performing a fifth regression analysis with the second measurements; and
determining second thickness measurements by performing a sixth regression analysis with the second measurements.

14. The process of claim 13, further comprising:
evaluating the fourth regression analysis and the first regression analysis to find critical dimension errors between the at least one first device in the first layer and the at least one opening in the photoresist layer;
evaluating the fifth regression analysis and the second regression analysis to find overlay errors between the at least one first device in the first layer and the at least one opening in the photoresist layer; and
evaluating the sixth regression analysis and the third regression analysis to find thickness errors between the at least one first device in the first layer and the at least one opening in the photoresist layer.

15. The process of claim 14, further comprising:
forming at least one third device over the substrate in at least one third layer over the first and second layers;
using the metrology instrument to obtain third measurements in the r, θ, z coordinate system of the at least one third device in the at least one third layer; and
comparing the third measurements of the at least one third device in the at least one third layer to the first measurements of the at least one first device in the first layer and the second measurements of the at least one second device in the second layer.

16. The process of claim 15, further comprising:
determining third critical dimension measurements by performing a seventh regression analysis with the third measurements;
determining third overlay measurements by performing an eighth regression analysis with the third measurements; and
determining third thickness measurements by performing a ninth regression analysis with the third measurements.

17. The process of claim 16, wherein comparing the third measurements to the first measurements and second measurements comprises:
comparing the seventh regression analysis to the first regression analysis and the fourth regression analysis to find critical dimension errors between the at least one third device in the third layer and the at least one first device in the first layer and to find critical dimension errors between the at least one third device in the third layer and the at least one second device in the second layer;
comparing the eighth regression analysis to the second regression analysis and the fifth regression analysis to find overlay errors between the at least one third device in the third layer and the at least one first device in the first layer and to find overlay errors between the at least one third device in the third layer and the at least one second device in the second layer; and
comparing the ninth regression analysis to the third regression analysis and the sixth regression analysis to find thickness errors between the at least one third device in the third layer and the at least one first device in the first layer and to find thickness errors between the at least one third device in the third layer and the at least one second device in the second layer.

18. The process of claim 14, further comprising:
calculating an open area between the at least one first device and the at least one second device; and determining if critical dimensions and overlay of at least one third device position the at least one third device in the open area.

19. The process of claim 18, further comprising:

adjusting the critical dimensions and overlay of the at least one third device before fabricating the at least one third device to position the at least one third device in the open area.

20. The process of claim 14, further comprising:

analyzing the first, second, third, fourth, fifth, and sixth regression analyses to determine a number of chips on the wafer with critical dimension and overlay errors.

* * * * *